US005786247A

[19] United States Patent
Chang et al.

[11] Patent Number: 5,786,247
[45] Date of Patent: Jul. 28, 1998

[54] LOW VOLTAGE CMOS PROCESS WITH INDIVIDUALLY ADJUSTABLE LDD SPACERS

[75] Inventors: Kuang-Yeh Chang, Los Gatos; Ramachandr A. Rao, Pleasanton, both of Calif.

[73] Assignee: VLSI Technology, Inc., San Jose, Calif.

[21] Appl. No.: 762,411

[22] Filed: Dec. 9, 1996

Related U.S. Application Data

[63] Continuation of Ser. No. 239,435, May 6, 1994, abandoned.
[51] Int. Cl.$^6$ ............................................. H01L 21/8238
[52] U.S. Cl. ........................ 438/231; 438/305; 438/307; 438/595; 438/981
[58] Field of Search ............................ 438/231, 230, 438/299, 303, 305, 307, 595, 981; 257/371, 376

[56] References Cited

U.S. PATENT DOCUMENTS

| 4,474,624 | 10/1984 | Mathews | 148/1.5 |
| 4,577,391 | 3/1986 | Hsia et al. | 29/571 |
| 4,992,389 | 2/1991 | Ogura et al. | |
| 5,021,354 | 6/1991 | Pfiester | 437/34 |
| 5,023,190 | 6/1991 | Lee et al. | 437/56 |
| 5,073,514 | 12/1991 | Ito et al. | |
| 5,087,582 | 2/1992 | Campbell et al. | 437/44 |
| 5,091,763 | 2/1992 | Sanches et al. | |
| 5,106,768 | 4/1992 | Kuo | 437/58 |
| 5,141,890 | 8/1992 | Haken | 437/44 |
| 5,291,052 | 3/1994 | Kim et al. | 257/369 |
| 5,416,036 | 5/1995 | Hsue | 437/44 |

OTHER PUBLICATIONS

Muraka: Electronic Materials Science and Technology, pp. 524–527.
"Applications of Anisotroptic Plasma Etching" Muraka: Electronic Materials Science and Technology, pp. 524–527.

Primary Examiner—John Niebling
Assistant Examiner—Long Pham
Attorney, Agent, or Firm—Burns, Doane, Swecker & Mathis, LLP

[57] ABSTRACT

The present invention relates to a method and device for providing CMOS logic which can be operated at various operating voltages, without resulting in unbalanced operation of n-channel and p-channel CMOS transistors. In accordance with the present invention, CMOS circuitry can be provided that is operable over a range of voltages (e.g., a range from below 3 volts to a range over 5 volts) without producing unbalanced operation of n-channel and p-channel transistors. Thus, integrated circuits formed in accordance with the present invention can be operated at different voltage power sources without requiring a redesign or relayout of the integrated circuit. In accordance with the present invention, CMOS transistors can be fabricated without increased fabrication complexity to provide transistors which operate within a relatively safe region of their operating characteristics and which operate with a speed that is unaffected by the reduced voltage supply (i.e., no need to accommodate timing errors since both n-channel and p-channel transistor performance remains balanced).

9 Claims, 3 Drawing Sheets

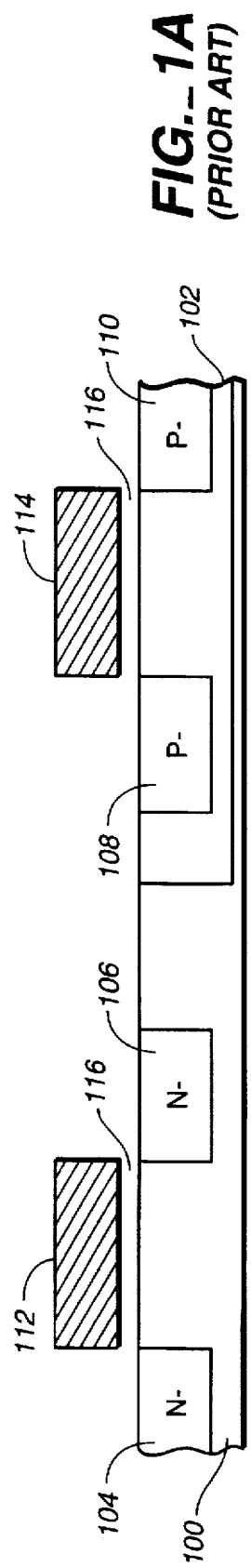
FIG._1A
*(PRIOR ART)*
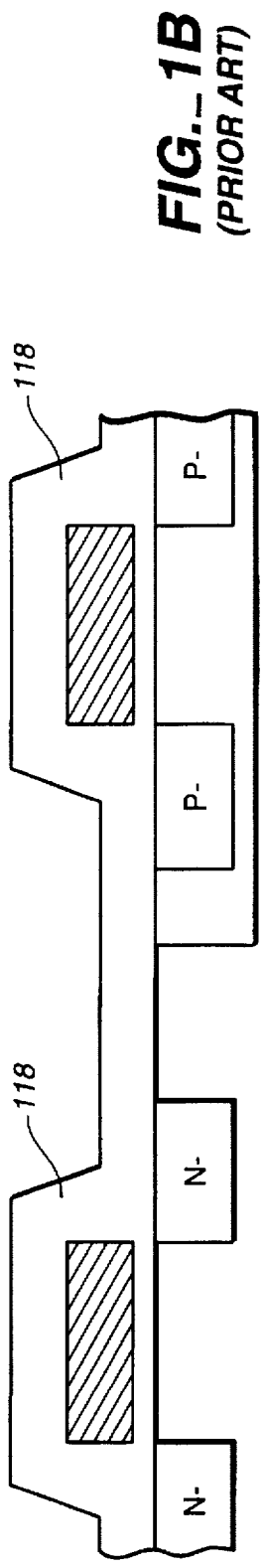
FIG._1B
*(PRIOR ART)*
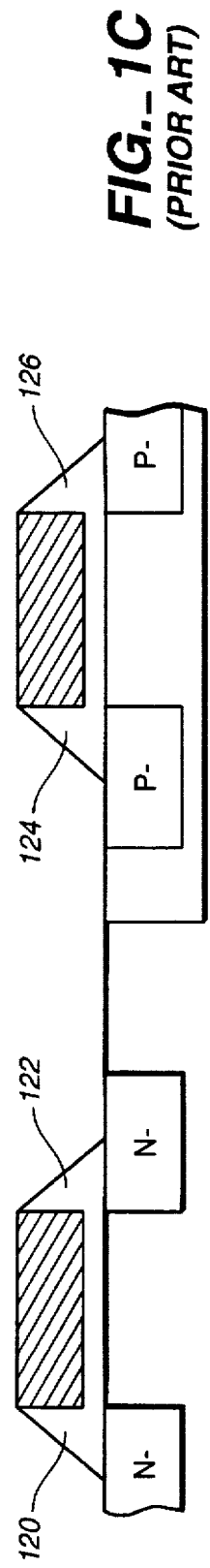
FIG._1C
*(PRIOR ART)*
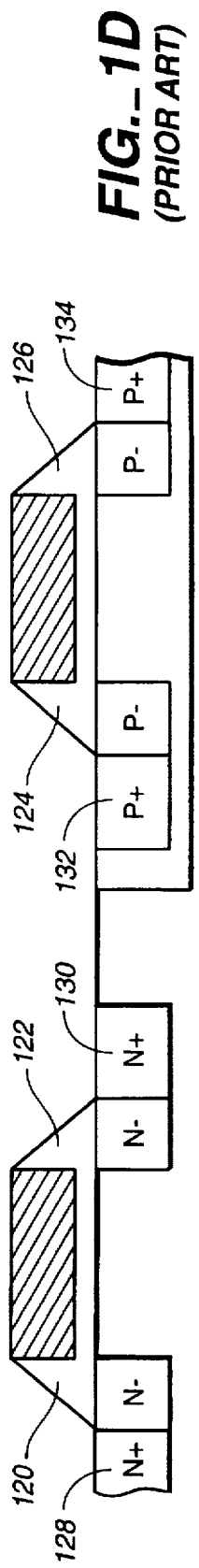
FIG._1D
*(PRIOR ART)*

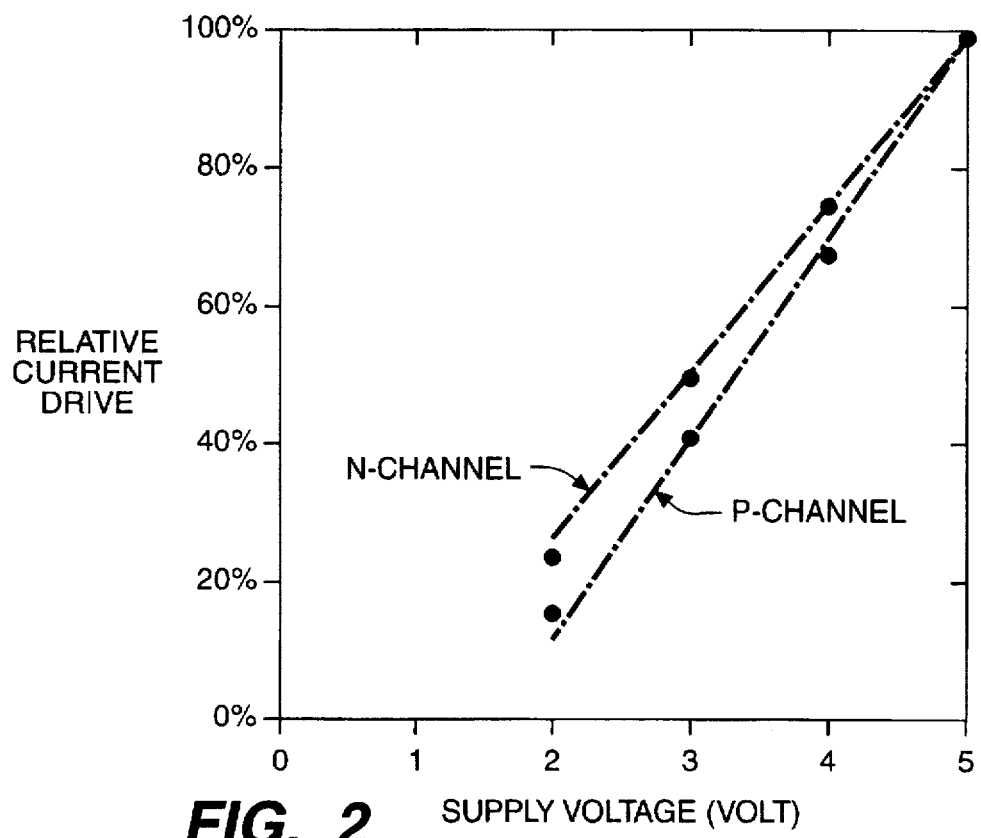
FIG._2
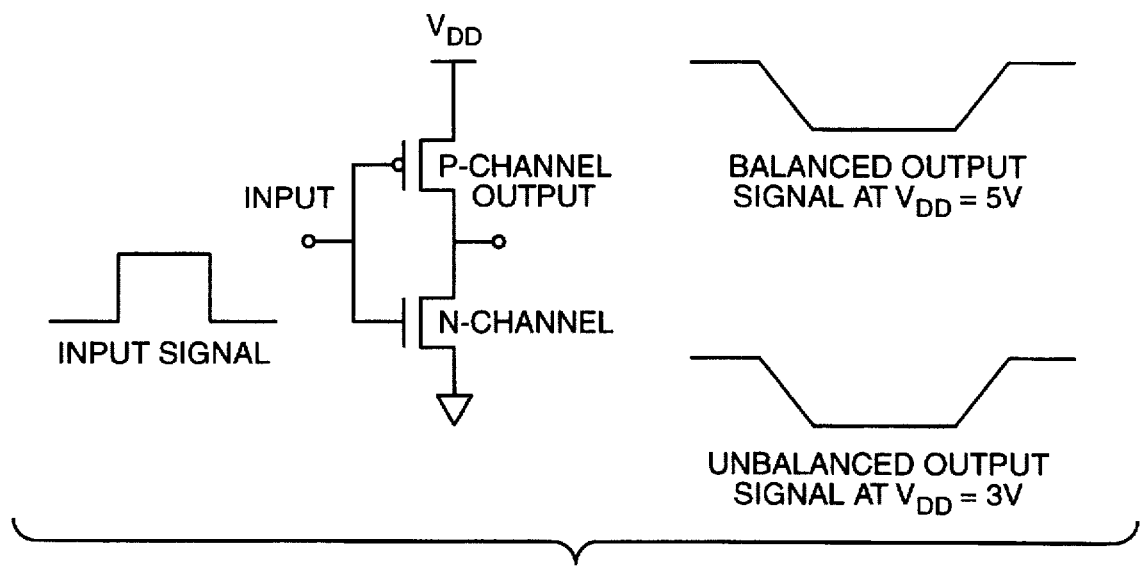
FIG._3

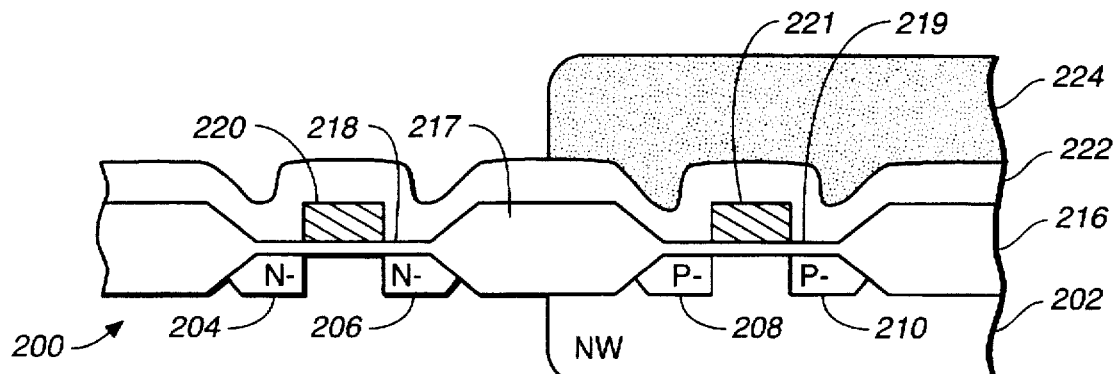
FIG._4A
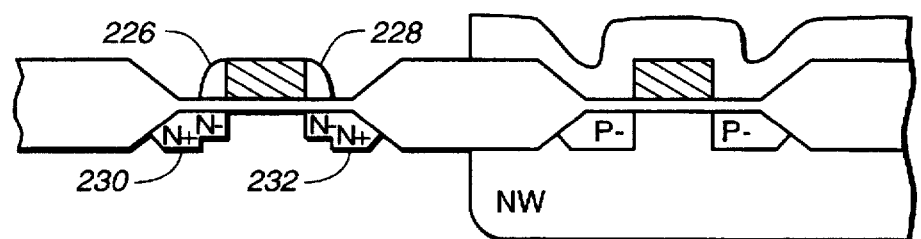
FIG._4B
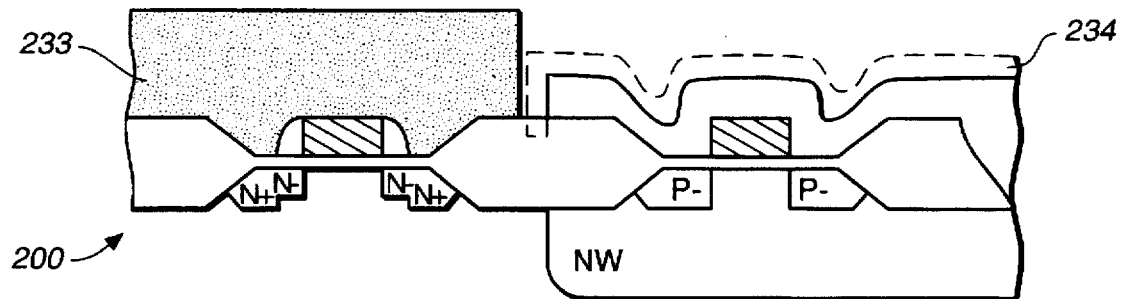
FIG._4C
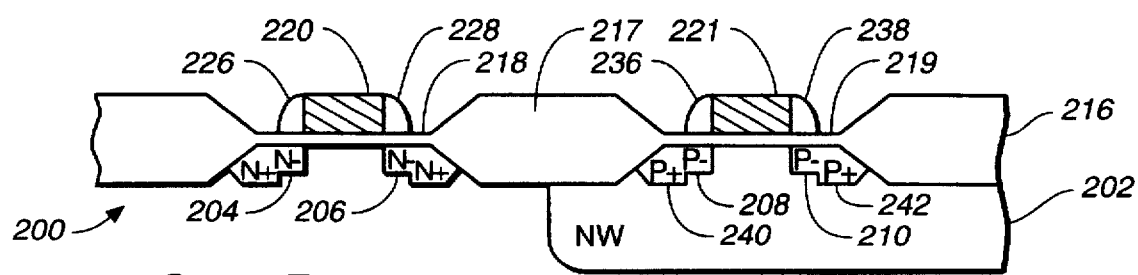
FIG._4D

LOW VOLTAGE CMOS PROCESS WITH INDIVIDUALLY ADJUSTABLE LDD SPACERS

This application is a continuation of application Ser. No. 08/239,435, filed May 6, 1994, now abandoned.

BACKGROUND OF THE INVENTION

1. Field of the Invention

The present invention relates generally to methods for fabricating integrated circuits using complementary metal oxide semiconductor (CMOS) technology. More particularly, the present invention relates to methods and devices for implementing CMOS technology while maintaining balance between p-channel and n-channel transistors when operated at reduced voltage supplies.

2. State of the Art

There has been a relatively recent trend to reduce the power supply voltage for CMOS devices. For example, when using CMOS transistors in battery powered environments, it is desirable to decrease power consumption by decreasing the voltage power source from, for example, 5 volts to 3 volts. Further, decreased voltage power sources are desirable for providing smaller CMOS technologies (i.e., reduced size transistors require decreased voltage power sources to avoid transistor damage).

One conventional technique for fabricating CMOS transistors which accommodates the need for reduced size transistors involves using low dose drain (LDD) technology, also referred to as lightly doped drains. LDD technology was created to reduce the hot electron effect which degrades the performance of relatively small transistors having short channels (i.e., transistor gates which are less than or equal to 1.2 microns in length). Unlike conventional transistors where the source and drain implant regions are self-aligned to the edge of a polysilicon gate, an LDD transistor has two low dose regions which are implanted in the substrate in alignment with the gate. Spacers are formed on the substrate adjacent to the gate, with the source and drain implant regions being displaced from the gate edge by the width of the spacers. FIG. 1D shows an n-channel transistor and a p-channel transistor formed in a common substrate, each of the transistors having low dose drain regions.

A typical process for forming the FIG. 1D transistors will be described with reference to FIGS. 1A to 1D. FIG. 1A illustrates a substrate 100 of a first conductivity type (e.g., p-type material) having a well region 102 formed with material of a second conductivity type (e.g., n-type material). An n-channel transistor is formed with lightly doped regions 104 and 106 of n-type material. A p-channel transistor is formed with lightly doped regions 108 and 110 of p-type material. The n-channel and p-channel transistors have gates 112 and 114, respectively. The gates are formed, for example, of polysilicon over a gate oxide 116.

Referring to FIG. 1B, a uniform layer of oxide 118 can be formed over the n-channel and p-channel transistors. The oxide 118 provides a layer from which spacers can be etched to displace the source and drain implant regions from the edges of the gates 112 and 114.

Referring to FIG. 1C, a blanket etch can be used to form the spacers 120 and 122 of the n-channel transistor at the same time spacers 124 and 126 are formed for the p-channel transistor. The uniform layer of oxide 118 from which the spacers are formed can, for example, be a material such as TEOS.

Referring to FIG. 1D, the spacers 120 to 126 are used to define the edge of the source and drain regions relative to the edge of the gate in each of the p-channel and n-channel transistors. Using the spacers, n+source and drain regions 128 and 130 can be formed with respect to the n-channel transistor. The p-channel transistor can be masked during formation of the source and drain regions in the n-channel transistor. Afterward, source and drain regions 132 and 134 can be formed for the p-channel transistor, with the n-channel transistor being masked. Thus, conventional techniques result in n-channel and p-channel transistors being configured with similarly sized LDD regions of equally dosed material.

Despite the advantages which can be realized by reducing the voltage power source (e.g., reduced power consumption and reduced size), significant complications can result from operating CMOS transistors designed for operation at a higher voltage source with a reduced voltage power source.

Unbalanced operation among p-channel and n-channel transistors can occur when the voltage power source is reduced. For example, 3 volt operation of CMOS technology designed for 5 volt operation can result in unbalanced operation among n-channel transistors relative to p-channel transistors. This is because n-channel transistors degrade differently than p-channel transistors when the voltage power source is reduced. FIG. 2 shows the relative degradation of current drive versus supply voltage for n-channel and p-channel transistors. The current drive of a p-channel transistor designed for operation with 5 volts, but actually operated at 3 volts, is decreased by 60%. The current drive of similarly operated n-channel transistor is decreased by only 50%. Thus, balanced current ratios of $I_{p-ch}$: $I_{n-ch}$=1:1 for a 5 volt power source (where $I_{p-ch}$ is the current drive of a p-channel transistor and $I_{n-ch}$ is the current drive of an n-channel transistor) can become unbalanced when a 3 volt power source is used. The current ratios of these transistors when operated with a 3 volt power source can be 0.8:1. This unbalanced operation among n-channel transistors and p-channel transistors can lead to significant timing errors when the transistors are used in a high speed circuit.

To illustrate circuit timing errors due to an unbalance among n-channel transistors and p-channel transistors, consider using an n-channel pull-up transistor in conjunction with a p-channel pull-down transistor. Here, both the n-channel transistor and the p-channel transistor have their gates tied together. When the pull-up and pull-down transistors are operated at the reduced voltage power supply of 3 volts, the unbalanced degradation of the p-channel and n-channel CMOS transistors will render the pull-up weaker (i.e., slower) while the pull-down will remain unaffected. If these CMOS transistors are relied upon for triggering a subsequent event, the relatively slow pull-up can detrimentally affect the triggering of subsequent transistors, and throw off timing within the integrated circuit. FIG. 3 shows an inverter circuit and a relative change in output pulse shape due to reduced supply voltage.

To address this problem, the entire integrated circuit can be redesigned to accommodate operation at the reduced voltage power source. As referenced herein, the term "redesign" can include appropriate sizing of n-channel transistor gates relative to p-channel transistor gates prior to circuit fabrication. The current drive, $I_{drive}$, between the source and drain of a CMOS transistor is proportional to gate width ($G_w$) divided by gate length ($G_l$); that is, $I_{drive}$ is proportional $G_w/G_l$. Thus, either $G_w$ can be increased or $G_l$ can be decreased to increase current drive of a p-channel transistor and balance its operation with the current drive of an n-channel transistor in the integrated circuit. Alternately, the gate of an n-channel transistor can be modified to balance the current drive of the p-channel transistors.

However, difficulties are encountered when attempts are made to increase or decrease relative gate sizes of p-channel and n-channel transistors. Gate lengths of typical CMOS transistors are already extremely small (e.g., on the order of 0.8 microns). Adjusting the relative gate sizes to achieve accurate balance between n-channel and p-channel transistors can therefore be complex, costly and impractical. Gate widths are typically larger than gate lengths, making them easier to adjust. However, a significantly increased gate width can be required to achieve the necessary balance. This resultant increase in transistor size can require a relayout of all transistors in the integrated circuit. This relayout process can also be complex, costly and possibly prohibitive if the overall integrated circuit chip size exceeds customer specifications.

Accordingly, it would be desirable to achieve the benefits of operating CMOS logic which has been designed for operation with a first voltage, at a second voltage (e.g., a relatively low voltage) without unbalancing operation among n-channel and p-channel transistors. By avoiding the possible occurrence of unbalanced operation, any need to redesign an integrated circuit containing such transistors, and any need to initiate a relayout of any such integrated circuit are avoided. It would also be desirable to provide a process of maintaining balanced operation which is relatively simple and straightforward, and which will not introduce increased fabrication complexity. Further, any such process should not detrimentally affect the speed of circuit operation, or detrimentally affect the operating characteristics of transistors by forcing their operation in a dangerous (e.g., unstable) region.

SUMMARY OF THE INVENTION

The present invention relates to a method and device for providing CMOS logic which can be operated at various operating voltages, without resulting in unbalanced operation of n-channel and p-channel CMOS transistors. In accordance with the present invention, CMOS circuitry can be provided that is operable over a range of voltages (e.g., a range from below 3 volts to a range over 5 volts) without producing unbalanced operation of n-channel and p-channel transistors. Thus, integrated circuits formed in accordance with the present invention can be operated at different voltage power sources without requiring a redesign or relayout of the integrated circuit. In accordance with the present invention, CMOS transistors can be fabricated without increased fabrication complexity to provide transistors which operate within a relatively safe region of their operating characteristics and which operate with a speed that is unaffected by the reduced voltage supply (i.e., no need to accommodate timing errors since both n-channel and p-channel transistor performance remains balanced).

Generally speaking, the present invention relates to a method for fabricating a CMOS transistor which includes the steps of forming a first gate in a first region of a substrate and a second gate in a second region of the substrate, and forming a layer of spacer material (e.g., TEOS) over the gates of the first and second regions. The method further includes a step of forming at least one spacer from the layer of spacer material in the first region during a first etch, and independently forming at least one additional spacer from the spacer material in the second region during a second etch.

In accordance with an alternate embodiment of the present invention, a single step can be used to form both the at least one spacer in the first region and the at least one additional spacer in the second region. A source and drain can then be formed in the first region using a first dose of conductive material, and a source and drain can be formed in the second region with a second dose of conductive material, with the second dose being different from the first dose.

BRIEF DESCRIPTION OF THE DRAWINGS

Other objects and advantages of the present invention will become more apparent from the following detailed description of preferred embodiments when read in conjunction with the accompanying drawings, wherein like elements are represented by like reference numerals and wherein:

FIGS. 1A to 1D illustrate a conventional fabrication technique for providing n-channel and p-channel CMOS transistors on a common substrate;

FIG. 2 shows an example of relative degradation of current drive versus supply voltage for n-channel and p-channel transistors;

FIG. 3 shows an exemplary inverter circuit and a relative change in output pulse shapes due to a variation in supply voltage; and FIGS. 4A to 4D illustrate an exemplary method of fabricating CMOS transistors in accordance with the present invention.

DETAILED DESCRIPTION OF THE PREFERRED EMBODIMENTS

FIGS. 4A–4D illustrate an exemplary method for fabricating an integrated circuit formed of CMOS transistors in accordance with the present invention. Referring to FIG. 4A, a substrate 200 is composed of a material having a first conductivity type (e.g., a p-type material). The substrate 200 is formed with a well region 202 of a second conductivity type material (e.g., n-type material). Those skilled in the art will, of course, recognize that any conductive materials can be used (e.g., the substrate can be formed of n-type material and the well formed of p-type material).

In accordance with the exemplary FIG. 4A embodiment, a lightly doped area is formed (e.g., implanted) in the gate region of each CMOS transistor. More particularly, the lightly doped area of an n-channel CMOS transistor illustrated in FIG. 4A can include lightly doped regions 204 and 206 formed of the second conductivity type material which, for purposes of the example discussed herein, will be referred to as an n-type material. Lightly doped regions 208 and 210, for the example discussed herein, are formed of p-type material in the p-channel transistor illustrated in FIG. 4A. An oxide layer 216 is formed on the substrate to establish thick field oxide regions 217 for insulating the separate transistors formed on the substrate. The oxide layer 216 also establishes gate oxide regions 218 and 219 in each of the n-channel and p-channel transistors, respectively.

Gates 220 and 221 are formed for each of the n-channel and p-channel transistors illustrated in FIG. 4A. For example, the gates can be formed by depositing polysilicon in the gate regions using conventional gate fabrication techniques.

A uniform layer of spacer material 222, such as TEOS, is formed over the entire transistor structure illustrated in FIG. 4A. The spacer material is formed over the gates 220 and 221, as well as over the exposed oxide layer 216.

In accordance with the present invention, rather than forming the spacers for the n-channel and p-channel transistors using a single masking step, the p-channel transistor is masked with a masking material 224 such as a photoresist. For example, the photoresist can be deposited over the entire p-channel transistor formed in the n-type material well region 202.

In the following discussion, reference will be made to FIGS. 4B and 4C to describe an etching of the spacer material 222 to independently form spacers for the p-channel transistor relative to the n-channel transistor. As referenced herein, the term "independently" is intended to encompass any technique whereby the spacers of one transistor formed on a substrate with a second transistor can have its spacers varied in size relative to the second transistor. The exact order in which the spacers of the various transistors are formed is not significant, and reference to formation of the n-channel transistor spacers before formation of the p-channel transistors spacers is by way of example only.

Referring to FIG. 4B, a first gate has been formed in a first region of a substrate and a second gate has been formed in a second region of a substrate, with a layer of spacer material formed over the gates in both the first and second regions. At least one spacer has been formed in the first region during a first etch. At least one additional spacer is formed in the second region during a second independent etch. The etching of the spacer material formed over the first gate region creates at least one LDD spacer of a first size adjacent to the first gate. An etching of the spacer material formed over the second gate region creates at least one additional LDD spacer of a second size which is different from the first size, adjacent to the second gate.

For example, the spacer material 222 is etched using conventional techniques to form spacers 226 and 228 of the n-channel transistor. Afterward, source and drain regions 230 and 232, respectively, can be formed (e.g., implanted) as heavily doped areas in the substrate. The source and drain regions are formed in the gate region of the n-channel transistor, with the source and drain regions being aligned in the substrate at an area defined by an edge of the spacers 226 and 228, respectively. The heavily doped source and drain regions of the n-channel transistor are designated as "n+" regions to denote a conductivity higher than that of the lightly doped regions designated "n–".

Once the heavily doped regions of the n-channel transistor have been formed, the masking material 224 is removed (e.g., stripped) from the p-channel transistor. Subsequently, the n-channel transistor is masked during a separate masking step with a masking material 233 (e.g., photoresist) as illustrated in FIG. 4C.

In accordance with the present invention, prior to independently etching the spacer material 222 to independently form spacers for the p-channel transistor, the entire layer of spacer material over the p-channel transistor is slightly etched using, for example, a dip etch. However, those skilled in the art will recognize that any etching process which can etch the layer of spacer material over the p-channel transistor can be used. A blanket etch of the spacer material layer before actual etching of the layer to form the p-channel transistor spacers permits spacers which are slightly thinner than those of the n-channel transistor to obtained.

Those skilled in the art will readily appreciate that while the use of a blanket etch with respect to the formation of spacers over the p-channel transistor is described herein, this description is by way of example only. For example, a blanket etch can be used with respect to the formation of the n-channel transistor spacers either before or after the spacers have been formed in the p-channel transistor.

The blanket etch results in a portion 234 of the spacer material layer 222 over the FIG. 4C p-channel transistor to be removed. In accordance with exemplary embodiments, the amount of the spacer material which is removed can be selected to achieve a predetermined reduction in width of the spacers which define LDD regions of the p-channel transistor.

As referenced herein, the "predetermined" reduction in width will vary depending on the specific application of the CMOS transistors. In accordance with exemplary embodiments described herein, the predetermined reduction is selected such that relative size of LDD regions in p-channel transistors versus those in n-channel transistors is adjusted to maintain symmetrical operation of these transistors. Symmetrical operation is achieved by adjusting the relative series resistance between the source and drain for each of the n-channel and p-channel transistors so that these transistors can provide balanced (i.e., symmetrical) operation.

The sheet resistance of an n+material is typically 30 to 50 ohms/square. Sheet resistance can be determined by measuring the conductivity of a square piece of the n+material by placing contacts on either side of a square piece. The sheet resistance of typical n–material is ten to fifty times greater than that of n+material (e.g., 1500 to 2500 ohms per square diffusion area). The series resistance of diffusion material is determined by multiplying the sheet resistance by the ratio of the gate length to the gate width:

$$\text{series resistance} = \text{sheet resistance} \cdot ((G_l)/(G_w))$$

Thus, if the gate width is equal to the gate length, the sheet resistance is equal to the series resistance. However, if the length of the gate is increased the series resistance will increase.

In accordance with the present invention, the width of the LDD region is adjusted in either the n-channel transistor, or the p-channel transistor, or any combination thereof, to effectively adjust their series resistances to obtain balanced operation. Because the sheet resistance of a typical lightly doped area is approximately ten times greater than that of a heavily doped area, adjustment of a lightly doped area can be used to more easily influence the series resistance of an LDD region. From a practicality standpoint, the lightly doped regions can be adjusted by regulating their length. For example, the length of a lightly doped p-region can be decreased to effect a decrease in the series resistance of this region and thus increase the current drive of the p-channel transistor without endangering operating characteristics of the p-channel transistor. The blanket etch of the spacer material during the steps of FIG. 4C results in the formation of p-channel spacers 236 and 238 (see FIG. 4D) which are smaller in size relative to those of the n-channel transistor spacers.

As illustrated in FIG. 4D, following the blanket etch of the portion 234 in FIG. 4C, the spacer material is etched to form at least one spacer over the gate region of the p-channel transistor. As illustrated in FIG. 4D, the two spacers 236 and 238 are formed over the lightly doped regions 208 and 210, respectively. Following the formation of the spacers 236 and 238, heavily doped areas can be formed in the substrate of the p-channel transistor gate region (e.g., implanted) to establish source and drain regions 240 and 242, respectively.

While the reduction in size of the LDD region of the p-channel transistor, as illustrated in FIG. 4D can achieve balanced operation without altering the operating characteristics of the n-channel and p-channel transistors, alternate embodiments of the present invention will be readily apparent to those skilled in the art. For example, balanced operation can also be achieved by increasing the size of the LDD region of the n-channel transistor (with an attendant reduction in n-channel current drive) or by providing a combination of an increase in size of the LDD region of the n-channel transistor and a reduction in size of the LDD region for the p-channel transistor. Alternately, in some circumstances, a reduction in size of the LDD region of the n-channel transistor and an increase in size of the p-channel transistor can be used to achieve a balanced operation among n-channel and p-channel transistors of a CMOS logic integrated circuit.

Alternately, a CMOS transistor can be fabricated in accordance with the present invention by forming a first gate in a first region of a substrate and a second gate in a second region of the substrate, and by forming a layer of spacer material over the gates of the first and second regions. Afterward, instead of independently forming the spacers in n-channel transistors versus those of p-channel transistors, all such spacers can be formed of equal size. Subsequently, during the implant of heavily doped regions in the n-channel transistor, a first dose of such material can be used. During subsequent implanting of the heavily doped regions of the p-channel transistor, a second dose, different from the first dose used to form the heavily doped regions of the n-channel transistors, can be used.

Thus, the series resistance of the source and drain regions of the n-channel transistor relative to those of the p-channel transistor can be used to alter series resistance between the gate and each of the source and drain regions in these different conductivity-type transistors. However, the use of differently dosed source and drain regions for n-channel transistors relative to p-channel transistors, while providing balanced operation, can alter the operating characteristics of these transistors. In alternate embodiments, a combination of different doses for LDD regions of n-type transistors relative to p-type transistors in conjunction with differently sized LDD regions can be used to achieve balanced operation.

Subsequent to forming the source and drain regions of the n-channel and p-channel transistors as illustrated in FIG. 4D, conventional techniques can be used to complete transistor fabrication. For example, after removing the masking material from the n-channel transistor and forming the source and drain regions of the p-channel transistor as illustrated in FIG. 4D, the silicon surface of the FIG. 4D structure can be passivated by performing an etch process to remove damaged material from the surface. Afterward, the surface can be annealed and reoxidized. Fabrication of the transistor structure can then be completed to form contacts using conventional techniques.

In accordance with the present invention, significant advantages can be realized. For example, a balanced operation of n-channel and p-channel transistors can be realized over a relatively widely varying voltage power source without altering the operating characteristics of these transistors. Rather, the series resistance of LDD regions can be altered to balance operating characteristics of n-channel transistors relative to p-channel transistors in a manner which does not affect operating characteristics.

Further, in exemplary embodiments wherein relative sizes of p-channel LDD regions are varied relative to n-channel LDD regions, such relative sizing can be achieved without the addition of any fabrication (e.g., masking) steps. Rather, as illustrated in the exemplary FIG. 4 embodiment, the masking steps used to form the heavily doped regions in each of the n-channel and p-channel transistors can be used to independently form spacers in each of these different conductivity transistors. Thus, fabrication techniques in accordance with the present invention can be implemented in a cost effective, straightforward manner.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method for fabricating an integrated circuit having at least one n-channel CMOS transistor and at least one p-channel CMOS transistor, said method comprising the steps of:

forming a substrate of a first conductivity-type material;

forming a well of a second conductivity-type material in said substrate;

forming lightly doped areas of said first conductivity-type material and of said second conductivity-type material in gate regions of said substrate;

forming an oxide layer on said substrate, the oxide layer establishing thick field oxide regions for separating the at least one n-channel CMOS transistor from the at least one p-channel CMOS transistor formed on the substrate, and establishing gate oxide regions in said gate regions of the substrate;

forming gates in said gate regions;

forming a uniform layer of spacer material over said gates and said oxide layer;

masking one of said p-channel transistor and said n-channel transistor with a masking material;

forming at least one spacer over said lightly doped area adjacent said gate of the other of said p-channel transistor and said n-channel transistor;

forming a heavily doped area in said substrate, said heavily doped area being formed in said gate region of said other transistor, and being defined by said at least one spacer;

removing said masking material from said one transistor;

masking the other of said p-channel transistor and said n-channel transistor with a masking material;

etching spacer material of said one transistor using a blanket etch;

forming at least one spacer over said lightly doped area adjacent said gate of said one transistor such that said blanket etch and said step of forming said at least one spacer of said one transistor provide spacers which are different in size with respect to the at least one spacer of said other transistor, said at least one spacer having a size selected to balance operation of said one transistor and said other transistor for a reduced power source of the integrated circuit; and forming a heavily doped area in said substrate, said heavily doped area being formed in said gate region of said one transistor and being defined by said at least one spacer of said one transistor.

2. Method according to claim 1 wherein said first conductivity-type material is a p-type material and said second conductivity material is an n-type material, said step of forming a uniform layer of spacer material further including:

depositing a layer of TEOS over said gates and said oxide layer.

3. Method according to claim 1, wherein said steps of forming a heavily doped area in the gate regions of said one transistor and said other transistor further include:

implanting heavily doped source and drain regions in areas of said substrate defined by said spacers.

4. Method according to claim 1, wherein said steps of forming said at least one spacer adjacent gates of said one transistor and said other transistor further includes:

etching the spacer material.

5. Method for fabricating a CMOS transistor comprising the steps of:

forming a first gate in a first region of a substrate and a second gate in a second region of said substrate;

forming a lightly doped area of a first conductivity-type material in said first region and a lightly doped area of a second conductivity-type material in said second region;

forming a layer of spacer material over said first gate and said second gate of said first and second regions;

forming at least one spacer from said spacer material in said first region and, subsequent to forming said at least one spacer, independently forming at least one additional spacer from said spacer material in said second region, said at least one additional spacer having a size selected to balance operation of said first and second regions for a reduced power source of the integrated circuit; and forming a heavily doped area of said first conductivity-type material in said first region and a heavily doped area of said second conductivity type material in said second region.

6. Method according to claim 5, wherein said spacer material is TEOS.

7. Method according to claim 5, wherein said step of independently forming at least one additional spacer further includes the steps of:

blanket etching the spacer material in said second region to reduce a thickness of said spacer material; and etching said reduced thickness spacer material to form said at least one additional spacer.

8. Method according to claim 5, wherein said first region is an n-channel region and said second region is a p-channel region and wherein said step of forming said at least one spacer and said at least one additional spacer further includes the steps of:

forming said at least one additional spacer smaller than said at least one spacer; and implanting source and drain regions in said second region which are larger in size than source and drain regions implanted in said first region.

9. Method for fabricating a CMOS transistor comprising:

forming a first gate over a first region of a substrate and a second gate over a second region of said substrate;

forming a lightly doped area of a first conductivity-type material in said first region and a lightly doped area of a second conductivity-type material in said second region;

forming a layer of spacer material over said first gate and said second gate of said first and second regions;

forming at least one spacer from said spacer material over said first region and at least one additional spacer from said spacer material over said second region;

implanting a first dose of a first conductive material in said first region; and implanting a second dose of a second type of conductive material in said second region, said second dose being greater than said first dose and being selected to balance operation of said first region and said second region for a reduced power source of the integrated circuit.

* * * * *